United States Patent
Modi et al.

(10) Patent No.: US 8,030,980 B2
(45) Date of Patent: Oct. 4, 2011

(54) SIMPLIFIED, EXTENDABLE, EDGE-BASED WATCHDOG FOR DLL

(75) Inventors: Samarth S. Modi, Bangalore (IN); Nitin Agarwal, Bangalore (IN); Mrityunjay Kr. Baranwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 12/624,047

(22) Filed: Nov. 23, 2009

(65) Prior Publication Data

US 2010/0164574 A1 Jul. 1, 2010

(30) Foreign Application Priority Data

Nov. 24, 2008 (IN) .................... 2904/CHE/2008

(51) Int. Cl.
*H03L 7/06* (2006.01)
(52) U.S. Cl. .................... 327/158; 327/149
(58) Field of Classification Search .......... 327/149, 327/158
See application file for complete search history.

(56) References Cited

U.S. PATENT DOCUMENTS

| | | | | |
|---|---|---|---|---|
| 6,794,913 B1* | 9/2004 | Stengel | ............ | 327/158 |
| 6,977,605 B2* | 12/2005 | Lee et al. | ............ | 341/161 |
| 7,486,120 B2* | 2/2009 | Kubo | ............ | 327/158 |
| 7,705,649 B1* | 4/2010 | Yu et al. | ............ | 327/175 |
| 7,911,245 B2* | 3/2011 | Ma | ............ | 327/145 |
| 2002/0196061 A1* | 12/2002 | Atyunin et al. | ............ | 327/158 |
| 2005/0110671 A1* | 5/2005 | Lee et al. | ............ | 341/162 |
| 2007/0176656 A1* | 8/2007 | Lesso | ............ | 327/158 |
| 2008/0030247 A1* | 2/2008 | Haerle et al. | ............ | 327/157 |
| 2010/0073060 A1* | 3/2010 | Nguyen | ............ | 327/255 |
| 2010/0085094 A1* | 4/2010 | Ma | ............ | 327/158 |
| 2010/0259435 A1* | 10/2010 | Yamamoto et al. | ............ | 341/166 |

* cited by examiner

*Primary Examiner* — Lincoln Donovan
*Assistant Examiner* — Adam Houston
(74) *Attorney, Agent, or Firm* — John J. Patti; Wade J. Brady, III; Frederick J. Telecky, Jr.

(57) ABSTRACT

A delay locked loop (DLL) is provided. Within this DLL is a watchdog circuit that determines whether harmonic lock is present. Based on this measurement, the watchdog circuit can provide adjustments to the DLL so as to change the length of the delay of the delay line to bring it within a predetermined range.

11 Claims, 2 Drawing Sheets

SIMPLIFIED, EXTENDABLE, EDGE-BASED WATCHDOG FOR DLL

CROSS-REFERENCE TO RELATED APPLICATIONS

This patent application claims priority from Indian Provisional Application No. 2904/CHE/2008, filed 24 Nov. 2008, the entirety of which is incorporated herein by reference.

TECHNICAL FIELD

The invention relates generally to a delay locked loop (DLL), and more particularly, to a DLL that includes watchdog circuit.

BACKGROUND

Referring to FIG. 1 of the drawings, the reference numeral 100 generally designates a conventional DLL. DLL 100 generally comprises a phase detector (PD) 102, a charge pump 104, a loop filter 106, and a delay line 108 (which includes a set of buffers 110-1 to 110-$n$). In operation, DLL 100 is supposed to lock so that total delay D of the delay line 108 is approximately equal to period of the reference clock signal REF. Lock is achieved with the help of PD 102; however, PD 102 is generally limited to operating under the condition that the delay D is between 0 and twice the period of the reference clock signal REF. If delay D is outside of this range, DLL 100 can potentially to lock to other multiples of the period of the reference clock signal REF (harmonic lock) and can cause functional failure. Thus, there is a need for a circuit to generally ensure that the delay remains in a predetermined range.

An example of another conventional DLL is U.S. Pat. No. 6,977,605.

SUMMARY

In accordance with a preferred embodiment of the present invention, an apparatus is provided. The apparatus comprises a phase detector (PD) that receives a clock signal; a charge pump that is coupled to the phase detector; a loop filter that is coupled to the charge pump; a delay line having a plurality of taps and a delay, wherein the delay line receives the clock signal, and wherein the delay line is coupled to the loop filter and the PD; a watchdog circuit that is coupled to the delay line so as to receive a first signal from a first tap of the plurality of taps and a second signal from a second tap of the plurality of taps, that receives the clock signal, and that is coupled to at least one of the charge pump and PD, wherein the watchdog circuit compares a rising edge from the first signal to a corresponding rising edge from the second signal, and wherein, when the rising edge from the first signal occurs before the corresponding rising edge from the second signal, the watchdog circuit determines that the delay of the delay line is within a predetermined range, and wherein, when the when the rising edge from the first signal occurs after the corresponding rising edge from the second signal, the watchdog circuit adjusts the charge pump so as to adjust the delay to be within the predetermined range.

In accordance with a preferred embodiment of the present invention, the delay line further comprises a plurality of buffers that are coupled in series with one another and that are each coupled to the loop filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
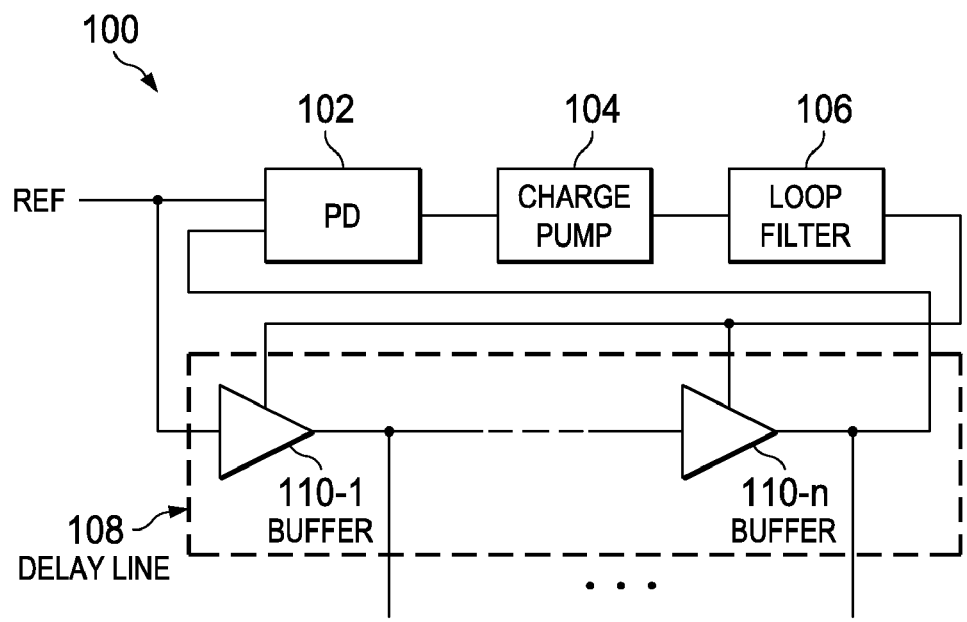
FIG. 1 is an example of a conventional DLL.

Refer now to the drawings wherein depicted elements are, for the sake of clarity, not necessarily shown to scale and wherein like or similar elements are designated by the same reference numeral through the several views.

Figure 2:
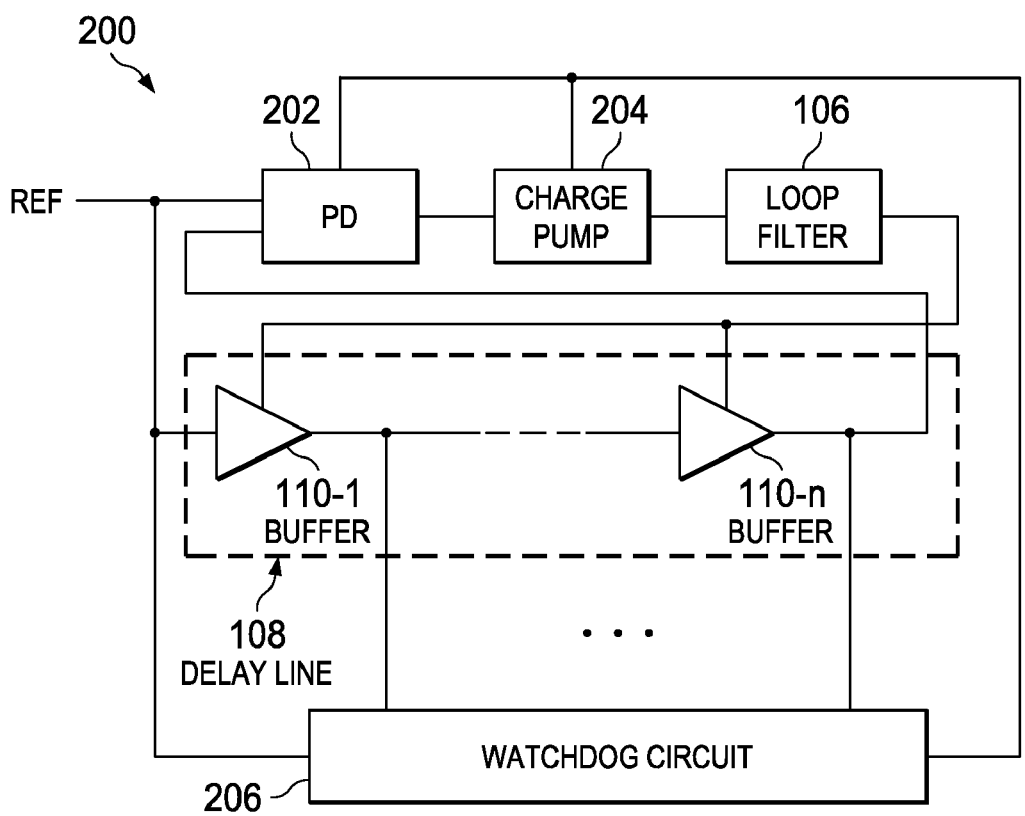
FIG. 2 is an example of a DLL in accordance with a preferred embodiment of the present invention.

Referring to FIG. 2 of the drawings, the reference numeral 200 generally designates a DLL in accordance with a preferred embodiment of the present invention. DLL 200 generally comprises PD 202, charge pump 204, loop filter 106, delay line 108, and watchdog circuit 206.

In operation, DLL 200 has a similar operation to DLL 100, but the watchdog circuit 206 is provided to generally ensure that the delay D of delay line 108 remains within a predetermined range. Typically, watchdog circuit 206 is coupled to several taps (typically two) from delay line or coupled to the outputs from two of the buffers 110-1 to 110-$n$ and receives the reference clock signal REF. Watchdog circuit 206 generally detects three edges from the delay line 108 (through the taps) to perform "harmonic detection." The first edge is generally an edge from the clock signal, while the second and third edges (E1 and E2, respectively) are from the taps such that the second edge (E1) occurs before the third edge (E2). Under the circumstances, where the edges occur in order, the delay D is determined to be within a predetermined range, and the watchdog circuit 206 outputs a harmonic detect signal HD to the PD 202 and/or charge pump 204 indicating this (i.e., HD=0). If the third edge occurs before the second edge, the watchdog circuit 206 determines that the delay D of the delay line 108 is outside of the predetermined range (i.e. D∉[0,2T], where T is the period of the reference clock signal REF), and the watchdog circuit 206 outputs a harmonic detect signal HD to the PD 202 and/or charge pump 204 indicating this (i.e., HD=1).

Figure 3:
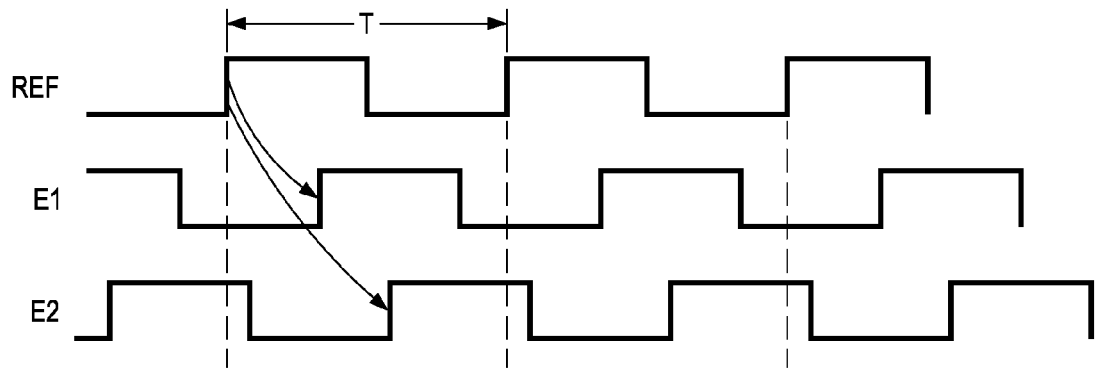
FIGS. 3 through 5 are example timing diagrams for the DLL of FIG. 2.
Figure 4:
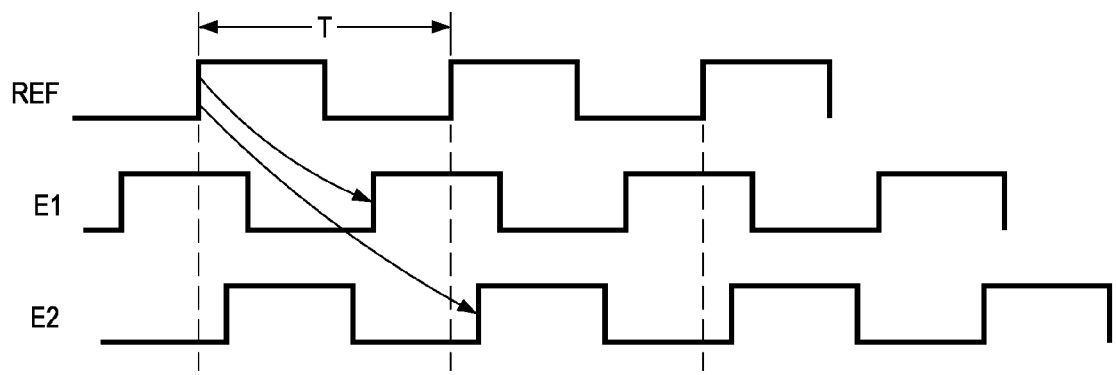
Figure 5:
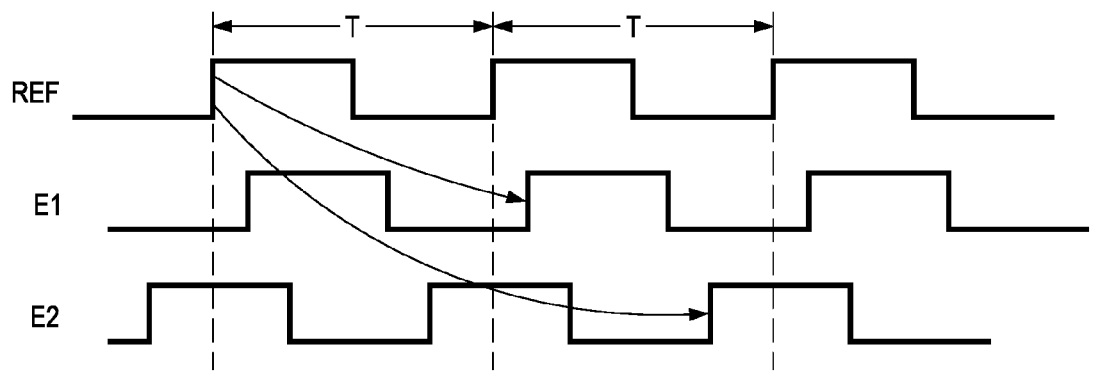

Turning now to FIGS. 3 through 5, example timing diagrams for the DLL 200 can be seen. In FIG. 3, the corresponding rising edges occur in order, so the harmonic detect signal from watchdog circuit 206 would reflect that the delay D of delay line 108 is within the predetermined range (i.e., D∈[0, 2T]). Thus, for FIG. 3, the watchdog circuit 206 outputs a harmonic detect signal HD to the PD 202 and/or charge pump 204 indicating this (i.e., HD=0). In FIG. 4, the delay for each of edges E1 and E2 are less than the period T of reference clock signal REF, but the difference between the delay for edge E2 and period T is less than the delay for edge E1 (i.e., DE2−T<DE1). So, for FIG. 4, the watchdog circuit 106 would output a harmonic detect signal HD (i.e., HD=1) to the PD 202 and/or charge pump 204 indicating that the delay D of the delay line 108 is outside of the predetermined range (i.e. D∉[0,2T]). In FIG. 5, the edges occur in order, so that the watchdog circuit 106 would output a harmonic detect signal HD (i.e., HD=0) to the PD 202 and/or charge pump 204 indicating that the delay D of the delay line 108 is within of the predetermined range (i.e. D∈[0,2T]).

As can be seen from FIGS. 3 through 5, the watchdog circuit 206 uses the timings of these edges to calculate a harmonic lock, but the harmonic is related to the choice of the edges E1 and E2. For the lower range of the watchdog circuit 206, the following equations are used:

$$DE2 > T \quad (1)$$

$$D > \frac{N*T}{E2}, \quad (2)$$

where N is the number of taps for delay line 108. For the upper range of the watchdog circuit 206, the following equations are used:

$$DE1 > T \text{ or } DE2 - T > DE1 \quad (3)$$

$$D < \min\left\{\frac{N*T}{E2}, \frac{N*T}{E2-E1}\right\} \quad (4)$$

For example, if N=48, E1=15 (15$^{th}$ tap), and E2=30 (30$^{th}$ tap), the watchdog circuit 206 will detect a harmonic when 1.6T<D<3.2T, so that this particular choice can detect the second and third harmonics. Additionally, multiple watchdog circuits 206 can be used in parallel with different taps (i.e., different values of E1 and E2) to determine whether higher order harmonic locks exist.

As an example, assuming the watchdog circuit 206 detects harmonic a harmonic lock condition (i.e., HD=1) from delay D1 (as per equation (2)) to D2 (as given by equation (4), watchdog circuit 206 will also detect harmonic from $$D2+M*D1 \text{ to} \quad (5)$$

$$D2+M*D2, \quad (6)$$

where M is a non-negative integer number. This property can reduce number of watchdog circuits 206 used in parallel to detect higher order harmonics. If an aim of the watchdog circuit 106 is to detect any harmonic less than the sixteenth harmonic for delay line containing 128 cells and if cases for only M=0 are considered, watchdog circuits 106 in parallel would be used. However, if cases for M>0 are considered, all the harmonics less than the seventeenth harmonic will be covered with first 3 watchdogs itself. Table 1 demonstrates these cases.

TABLE 1

| N | 128 | | | | | | | | | | | | |
|---|---|---|---|---|---|---|---|---|---|---|---|---|---|
| T | 1 | | | | NT/(E2− | M = 0 | | M = 1 | | M = 2 | | M = 3 | |
| No | E1 | E2 | NT/E2 | NT/E1 | E1) | L | H | L | H | L | H | L | H |
| 1 | 32 | 64 | 2.0 | 4.0 | 4.0 | 2.0 | 4.0 | 6.0 | 8.0 | 10.0 | 12.0 | 14.0 | 16.0 |
| 2 | 17 | 34 | 3.8 | 7.5 | 7.5 | 3.8 | 7.5 | 11.3 | 15.1 | 18.8 | 22.6 | 26.4 | 30.1 |
| 3 | 9 | 18 | 7.1 | 14.2 | 14.2 | 7.1 | 14.2 | 21.3 | 28.4 | 35.6 | 42.7 | 49.8 | 56.9 |
| 4 | 5 | 10 | 12.8 | 25.6 | 25.6 | 12.8 | 25.6 | 38.4 | 51.2 | 64.0 | 76.8 | 89.6 | 102.4 |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a phase detector (PD) that receives a clock signal;
   a charge pump that is coupled to the phase detector;
   a loop filter that is coupled to the charge pump;
   a delay line having a plurality of taps and a delay, wherein the delay line receives the clock signal, and wherein the delay line is coupled to the loop filter and the PD;
   a watchdog circuit that is coupled to the delay line so as to receive a first signal from a first tap of the plurality of taps and a second signal from a second tap of the plurality of taps, that receives the clock signal, and that is coupled to at least one of the charge pump and PD, wherein the watchdog circuit compares a rising edge from the first signal to a corresponding rising edge from the second signal, and wherein, when the rising edge from the first signal occurs before the corresponding rising edge from the second signal, the watchdog circuit determines that the delay of the delay line is within a predetermined range, and wherein, when the when the rising edge from the first signal occurs after the corresponding rising edge from the second signal, the watchdog circuit adjusts the charge pump so as to adjust the delay to be within the predetermined range.

2. The apparatus of claim 1, wherein the delay line further comprises a plurality of buffers that are coupled in series with one another and that are each coupled to the loop filter.

3. The apparatus of claim 2, wherein the predetermined range is the range of the phase detector.

4. The apparatus of claim 2, wherein the watchdog circuit calculates whether a harmonic lock condition exists and provides a harmonic detect signal to at least one of the charge pump and PD that indicates whether the harmonic lock condition exists.

5. The apparatus of claim 4, wherein the watchdog further comprises a plurality of watchdog circuits coupled in parallel with one another to determine whether higher order harmonic lock conditions are present.

6. An apparatus comprising:
- a delay-locked loop (DLL) that receives a clock signal and that generates a plurality of delay signals, wherein the DLL has a delay;
- a watchdog circuit that is coupled to the DLL so as to receive a first delay signal from the plurality of delay signals and a second delay signal from the plurality of delay signals and that receives the clock signal, wherein the watchdog circuit compares a rising edge from the first delay signal to a corresponding rising edge from the second delay signal, and wherein, when the rising edge from the first signal occurs before the corresponding rising edge from the second signal, the watchdog circuit determines that the delay of DLL is within a predetermined range, and wherein, when the when the rising edge from the first signal occurs after the corresponding rising edge from the second signal, the watchdog circuit adjusts the DLL so as to adjust the delay to be within the predetermined range.

7. The apparatus of claim 6, wherein the predetermined range is a phase detector range.

8. The apparatus of claim 6, wherein the watchdog circuit calculates whether a harmonic lock condition exists and provides a harmonic detect signal to the DLL that indicates whether the harmonic lock condition exists.

9. The apparatus of claim 8, wherein the watchdog further comprises a plurality of watchdog circuits coupled in parallel with one another to determine whether higher order harmonic lock conditions are present.

10. A method comprising:
- receiving a rising edge from a clock signal;
- receiving a first corresponding rising edge from a first tap in a delay line of a DLL;
- receiving a second corresponding rising edge from a second tap of the delay line of the DLL, wherein the first and corresponding rising edges correspond to the rising edge of the clock signal;
- if the second corresponding rising edge occurs before the first corresponding rising edge, indicating a harmonic lock condition; and
- adjusting a charge pump of the DLL so that the first corresponding clock edge occurs before the second corresponding clock edge.

11. The method of claim 10, wherein the method further comprises the step of indicating the harmonic lock condition if either of the first and second corresponding rising edges from the first and second taps, respectively, occurs before the rising edge of the clock signal.

* * * * *